(12) United States Patent
Ista

(10) Patent No.: US 12,461,323 B2
(45) Date of Patent: Nov. 4, 2025

(54) OPTICAL MODULE WITH INTEGRATED HEATSINKS

(71) Applicant: Lumentum Operations LLC, San Jose, CA (US)

(72) Inventor: Tyler Ista, San Rafael, CA (US)

(73) Assignee: Lumentum Operations LLC, San Jose, CA (US)

( * ) Notice: Subject to any disclaimer, the term of this patent is extended or adjusted under 35 U.S.C. 154(b) by 296 days.

(21) Appl. No.: 18/164,889

(22) Filed: Feb. 6, 2023

(65) Prior Publication Data

US 2024/0168246 A1 May 23, 2024

Related U.S. Application Data

(60) Provisional application No. 63/384,686, filed on Nov. 22, 2022.

(51) Int. Cl.
*G02B 6/42* (2006.01)
*H04B 1/036* (2006.01)
*H05K 1/02* (2006.01)
*H05K 7/20* (2006.01)

(52) U.S. Cl.
CPC ......... *G02B 6/4269* (2013.01); *H05K 1/0203* (2013.01); *H05K 7/20136* (2013.01); *G02B 6/4256* (2013.01); *H04B 1/036* (2013.01); *H05K 7/20145* (2013.01); *H05K 7/20154* (2013.01)

(58) Field of Classification Search
CPC .. G02B 6/4256; G02B 6/4266; G02B 6/4268; G02B 6/4269; G02B 6/4284; H05K 1/0203; H05K 7/20136; H05K 7/20145; H05K 7/20154; H05K 7/20409; H05K 7/20554; H05K 7/20718; H04B 1/036
See application file for complete search history.

(56) References Cited

U.S. PATENT DOCUMENTS

| | | | |
|---|---|---|---|
| 10,073,230 B2 | 9/2018 | Wilcox et al. | |
| 10,567,084 B2* | 2/2020 | Zhang | H05K 7/2039 |
| 12,191,220 B2* | 1/2025 | Wan | H01L 23/15 |
| 2004/0062491 A1* | 4/2004 | Sato | G02B 6/4266 |
| | | | 385/88 |
| 2010/0206522 A1* | 8/2010 | Zhou | H01L 23/467 |
| | | | 165/104.26 |
| 2016/0198586 A1* | 7/2016 | Bouda | G02B 6/4273 |
| | | | 361/716 |
| 2021/0072473 A1* | 3/2021 | Wall, Jr. | H05K 1/0274 |
| 2021/0278614 A1* | 9/2021 | Kubo | G02B 6/4257 |
| 2022/0075133 A1* | 3/2022 | Lin | G02B 6/4272 |
| 2022/0269019 A1 | 8/2022 | Edwards, Jr. et al. | |
| 2023/0228956 A1* | 7/2023 | Kung | G02B 6/3814 |
| | | | 385/92 |

\* cited by examiner

*Primary Examiner* — Jayprakash N Gandhi
*Assistant Examiner* — Steven Ngo
(74) *Attorney, Agent, or Firm* — Harrity & Harrity, LLP

(57) ABSTRACT

In some implementations, an optical module includes a housing and a circuitry component disposed within the housing, the circuitry component including an optical subassembly and a digital signal processor. The optical module may include a first heatsink above the optical subassembly, and a second heatsink above the digital signal processor, where the second heatsink is separated from the first heatsink by an air gap.

20 Claims, 4 Drawing Sheets

OPTICAL MODULE WITH INTEGRATED HEATSINKS

CROSS-REFERENCE TO RELATED APPLICATION

This Patent application claims priority to U.S. Provisional Patent Application No. 63/384,686, filed on Nov. 22, 2022, and entitled "HEAT SOURCE SELECTIVE INTEGRATED HEATSINK FOR A HEATSINK-INTEGRATED PLUGGABLE FIBER OPTICAL TRANSCEIVER." The disclosure of the prior Application is considered part of and is incorporated by reference into this Patent Application.

TECHNICAL FIELD

The present disclosure relates generally to optical modules and to an optical module with integrated heatsinks.

BACKGROUND

Pluggable optical modules, such as pluggable transceivers, may include multiple internal components to enable high-speed communications in an optical communication system. For example, a pluggable optical module may include a digital signal processor (DSP), a transmitter optical subassembly (TOSA), a receiver optical subassembly (ROSA), a transmitter/receiver optical subassembly (TROSA), and/or electronics associated therewith.

SUMMARY

In some implementations, an optical module includes a housing and a circuitry component disposed within the housing. The circuitry component may include an optical subassembly and a digital signal processor. The optical module may include a first heatsink above the optical subassembly, where the first heatsink is connected to the optical subassembly and separated from the housing. The optical module may include a second heatsink above the digital signal processor, where the second heatsink is connected to the housing and separated from the first heatsink.

In some implementations, an optical module includes a housing having a first wall and a second wall opposite the first wall. The optical module may include a circuitry component disposed within the housing between the first wall and the second wall, the circuitry component including an optical subassembly and a digital signal processor. The optical module may include a first heatsink above the optical subassembly, where the first heatsink is connected to the optical subassembly and separated from the housing, and where the second wall has an opening and the first heatsink extends through the opening. The optical module may include a second heatsink above the digital signal processor, where a portion of the second wall is recessed toward the circuitry component to define a platform for the second heatsink, and where the second heatsink is connected to the platform and separated from the first heatsink.

In some implementations, an optical module includes a housing and a circuitry component disposed within the housing, the circuitry component including an optical subassembly and a digital signal processor. The optical module may include a first heatsink above the optical subassembly, and a second heatsink above the digital signal processor, where the second heatsink is separated from the first heatsink by an air gap.

DETAILED DESCRIPTION

Figure 1:
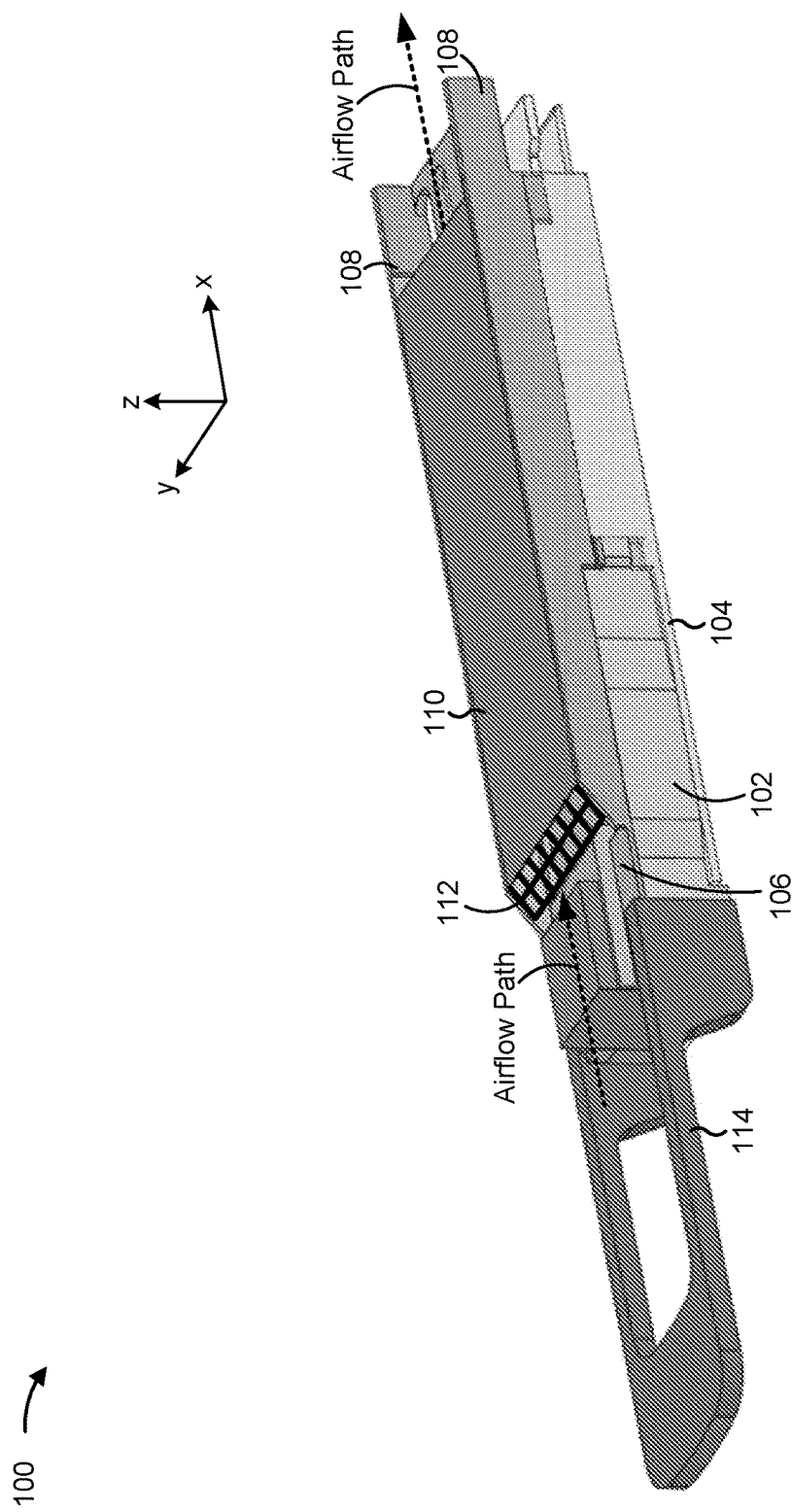
FIG. 1 is a perspective view of an example optical module.

The following detailed description of example implementations refers to the accompanying drawings. The same reference numbers in different drawings may identify the same or similar elements.

An optical module (e.g., an octal small form factor pluggable (OSFP) optical module) may include several heat-generating components. In some examples, the optical module may include an integrated heatsink to dissipate heat from heat-generating components. The optical module may be plugged into equipment configured to cause air to flow (e.g., using a fan) over the heatsink to dissipate heat from the optical module. Generally, the heatsink may be long and narrow, extending longitudinally down a length of the optical module. This type of heatsink may be inefficient when the optical module has one or more components associated with high power density (e.g., high heat generation) and one or more components associated with low power density (e.g., low heat generation). In some examples, a component associated with high power density may be located in the optical module near a component associated with low power density. Here, the heatsink may allow heat to travel from the component associated with high power density to the component associated with low power density, which may be temperature-sensitive. Moreover, airflow over the heatsink may create effectively the same airflow drag (e.g., restriction) at all regions of the heatsink. However, the regions of the heatsink nearer to components associated with high power density may disproportionately contribute to heat transfer into ambient air.

Some implementations herein provide an optical module with integrated heatsinks configured to maximize convection surface area near regions of the optical module associated with high power density and to minimize paths for low-restriction heat transfer to temperature-sensitive components of the optical module. In some implementations, the optical module may include a housing that contains an optical subassembly and a first heatsink above the optical subassembly, and contains a digital signal processor (DSP) and a second heatsink above the DSP. The first heatsink may be separated from the housing and separated from the second heatsink by air gaps. In this way, low-restriction thermal paths between the first heatsink and the second heatsink may be eliminated, thereby thermally isolating the first heatsink from the second heatsink to facilitate independent operation of the first heatsink and the second heatsink. This may reduce the influence that the high-power DSP has on a temperature of the temperature-sensitive optical subassembly. As a result, heat generating components of the optical module may be cooled more efficiently, thereby extending a life of the components and of the optical module.

Moreover, the first heatsink and the second heatsink may be configured to reduce airflow drag. For example, the first heatsink may have a lesser width than a width of the second heatsink, thereby facilitating airflow around the first heatsink in addition to airflow through the first heatsink. In addition, a height of the second heatsink may be increased relative to conventional designs, thereby reducing airflow drag. In this way, an amount of power needed to pump air through the optical module may be reduced. Furthermore, air may reach components downstream of the optical module at an improved airflow rate, thereby providing more efficient cooling of such components and extending a life of the components.

FIG. 1 is a perspective view of an example optical module 100. The optical module 100 may be an optical transceiver. For example, the optical module 100 may be configured to convert optical signals into electrical signals and to convert electrical signals into optical signals. The optical module 100 may be in a pluggable form factor (e.g., for plugging into a cage disposed in a network device). For example, the optical module 100 may be an OSFP optical module, an OSFP extra dense (OSFP-XD) optical module, or another heatsink-integrated pluggable fiber optical transceiver.

The optical module 100 may include a housing 102. The housing 102 may be configured to contain components of the optical module 100. The housing 102 may be composed of one or more metals or metal alloys. The housing 102 may be die cast. The housing 102 may generally be in the shape of an elongated box. The housing 102 may include a first wall 104 (e.g., a bottom wall) and a second wall 106 (e.g., a top wall) opposite the first wall 104, and one or more components of the optical module 100 may be disposed between the first wall 104 and the second wall 106. In some implementations, the housing 102 may include side rails 108 that project from the second wall 106 in a direction away from the first wall 104. The housing 102 may define an airflow path from a front of the housing 102 to a back of the housing 102 (in the direction of the arrows shown). For example, the airflow path may be above the second wall 106 between the side rails 108.

In some implementations, the housing 102 may include a cover 110, connected to the side rails 108, that further defines the airflow path. In some implementations, the optical module 100 may include a shielding element 112 located at an end of the airflow path (e.g., located at both ends of the airflow path). For example, the shielding element 112 may be located at an opening defined by the second wall 106, the side rails 108, and the cover 110. The shielding element 112 may be a metal mesh that provides electromagnetic isolation of components contained in the housing 102 while permitting air to flow through the airflow path. In some implementations, the optical module 100 may include a handle 114, attached to the housing 102, to facilitate plugging or unplugging of the optical module 100.

As indicated above, FIG. 1 is provided as an example. Other examples may differ from what is described with regard to FIG. 1.

Figure 2:
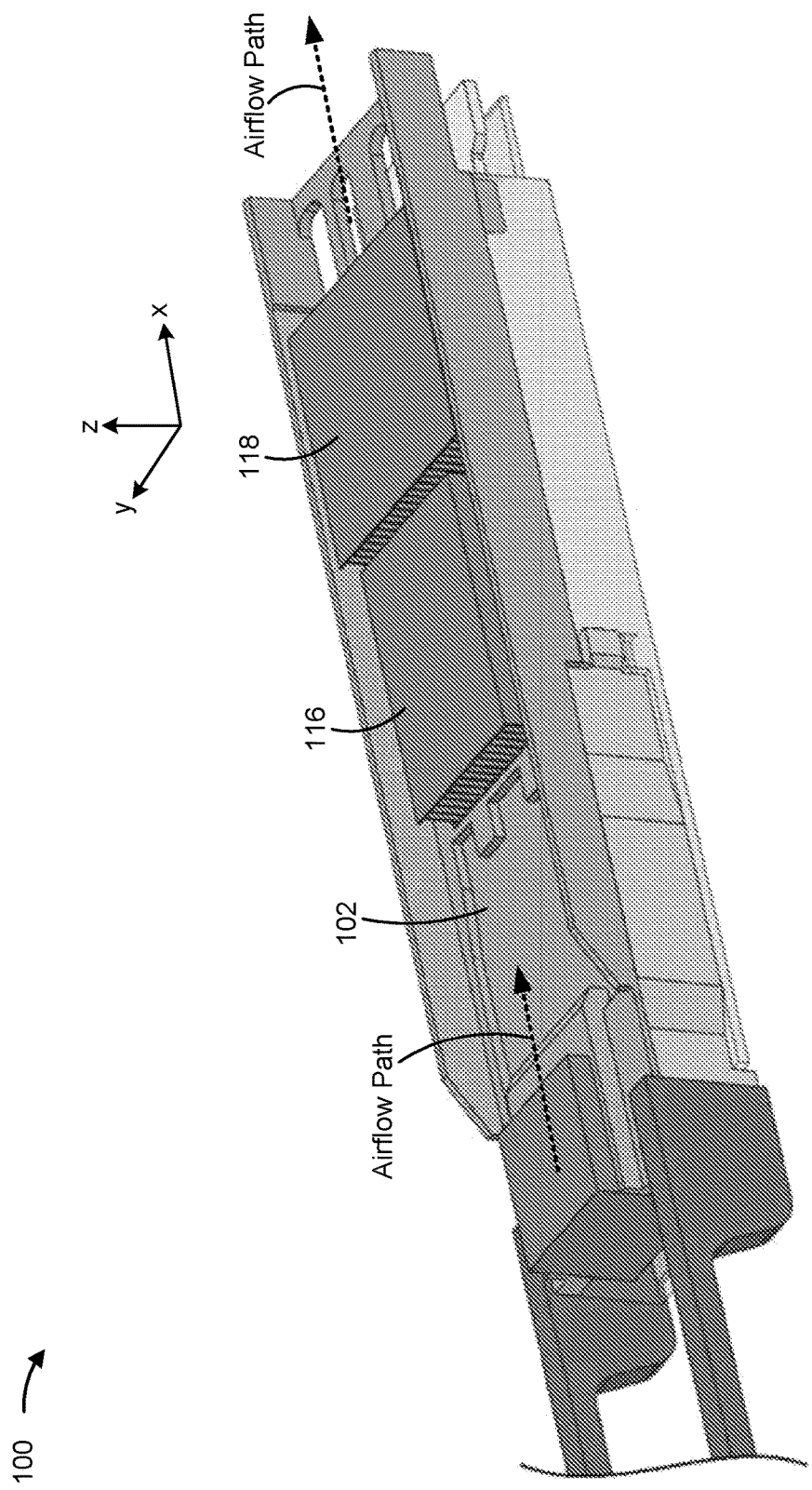
FIG. 2 is a perspective view of the optical module of FIG. 1 shown with no cover.

FIG. 2 is a perspective view of the optical module 100 shown with no cover 110. The optical module 100 may include a first heatsink 116 and a second heatsink 118 (e.g., the first heatsink 116 and the second heatsink 118 may be integrated into the optical module 100). As shown, the first heatsink 116 and the second heatsink 118 may include plate fins. In some implementations, the first heatsink 116 and the second heatsink 118 may include pin fins or another type of fin. The first heatsink 116 and the second heatsink 118 may be in (e.g., wholly or partially) the airflow path defined in the housing 102. The first heatsink 116 and the second heatsink 118 may extend longitudinally down a length of the optical module 100 (along the x-axis shown). Fins of the first heatsink 116 may extend in the same direction as fins of the second heatsink 118 (e.g., fins of the first heatsink 116 may be parallel to fins of the second heatsink 118). For example, fins of the first heatsink 116 and fins of the second heatsink 118 may extend in an airflow direction (shown by arrows) of the airflow path (e.g., fins of the first heatsink 116 and fins of the second heatsink 118 may extend parallel to the airflow direction).

In some implementations, a first height (e.g., a maximum height) of the first heatsink 116 (along the z-axis shown, projecting from an outward surface of the second wall 106) may be less than a second height (e.g., a maximum height) of the second heatsink 118 (e.g., fins of the second heatsink 118 may be taller than fins of the first heatsink 116). In some implementations, the first heatsink 116 may include a first quantity of fins, and the second heatsink 118 may include a second quantity of fins different from the first quantity of fins. In some implementations, the first quantity of fins may be the same as the second quantity of fins. In some implementations, fins of the first heatsink 116 may be separated by a first spacing distance, and fins of the second heatsink 118 may be separated by a second spacing distance different from the first spacing distance. In some implementations, the first spacing distance may be the same as the second spacing distance.

As indicated above, FIG. 2 is provided as an example. Other examples may differ from what is described with regard to FIG. 2.

Figure 3:
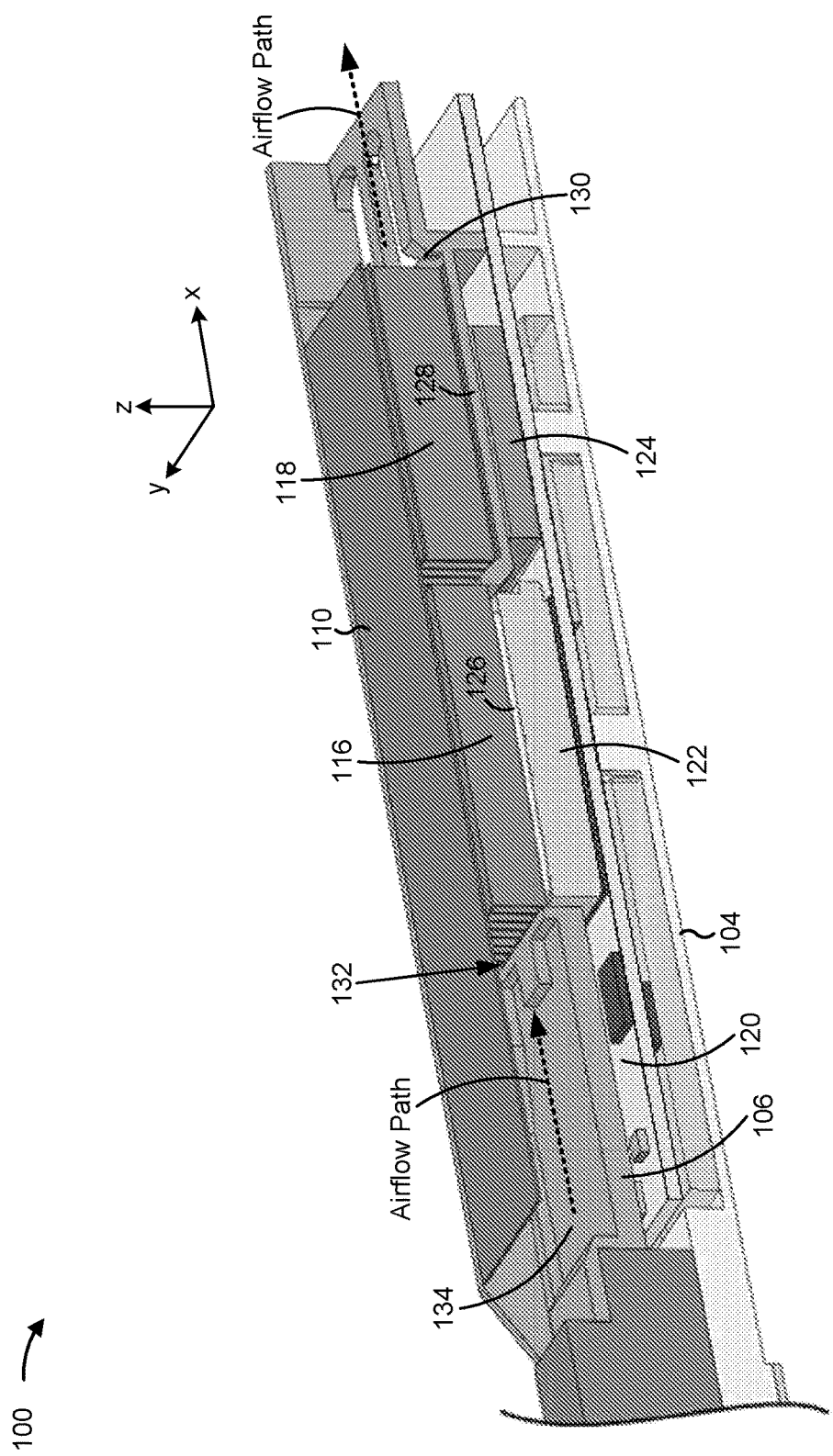
FIG. 3 is a cutaway perspective view of the optical module of FIG. 1.

FIG. 3 is a cutaway perspective view of the optical module 100. The optical module 100 may include a circuitry component 120 disposed within the housing 102. For example, the circuitry component 120 may be located between the first wall 104 and the second wall 106 of the housing 102. The circuitry component 120 may include a circuit board, such as a printed circuit board (PCB). The circuitry component 120 may include an optical subassembly 122. For example, the optical subassembly 122 may be connected (e.g., electrically connected) to the circuit board. The optical subassembly 122 may include a receiver optical subassembly (ROSA), a transmitter optical subassembly (TOSA), or a transmitter-receiver optical subassembly (TROSA). The circuitry component 120 may include a DSP 124. For example, the DSP 124 may be connected (e.g., electrically connected) to the circuit board. The optical subassembly 122 and the DSP 124 may be heat-generating components (e.g., high power density components) of the optical module 100. In some implementations, a height of the optical subassembly 122 (along the z-axis shown) may be greater than a height of the DSP 124.

The first heatsink 116 may be above (along the z-axis shown) the optical subassembly 122. For example, a footprint of the first heatsink 116 may fully or partially overlap with a footprint of the optical subassembly 122 (along the x-axis and the y-axis shown). The second heatsink 118 may be above (along the z-axis shown) the DSP 124. For example, a footprint of the second heatsink 118 may fully or partially overlap with a footprint of the DSP 124 (along the x-axis and the y-axis shown). In this way, the heatsinks 116, 118, which cause airflow drag, may be concentrated to regions associated with high power density, thereby minimizing overall drag while also minimizing distances between power sources and heatsink-to-air interfaces. As shown, the optical subassembly 122 and the first heatsink 116 may be upstream of the DSP 124 and the second heatsink 118 in an airflow direction (shown by arrows) of the airflow path. However, in some implementations, the DSP 124 and the second heatsink 118 may be upstream of the optical subassembly 122 and the first heatsink 116 in the airflow direction of the airflow path.

In some implementations, a portion of the second wall 106 of the housing 102 may be recessed toward the circuitry component 120 (e.g., toward the first wall 104) to define a platform 128 for the second heatsink 118 (e.g., because the DSP 124 may be shorter than the optical subassembly 122). The platform 128 may extend above the DSP 124. The second heatsink 118 may be disposed on the platform 128. For example, the second heatsink 118 may be connected to the platform 128, such as by solder. Additionally, or alternatively, the second heatsink 118 may be connected to the cover 110, such as by solder. Thus, the second heatsink 118 may be connected to the housing 102 and separated from the DSP 124 (e.g., by the platform 128). The platform 128 may be separated from the DSP 124 by an air gap or the platform 128 may be in contact with the DSP 124. Recessing the second wall 106 to define the platform 128 allows for fins of the second heatsink 118 to be increased in height, thereby increasing a heat-dissipation capacity of the second heatsink 118 and reducing drag of airflow through the second heatsink 118. Furthermore, a distance between the DSP 124 and a heatsink-to-air interface is reduced by recessing the second wall 106.

Recessing the second wall 106 to define the platform 128 may also define a step 130 where the second wall 106 transitions from an un-recessed region to the recessed platform 128. The step 130 may be in the airflow path (e.g., downstream of the second heatsink 118). In some implementations, the step 130 may include one or more openings therethrough to improve airflow at the step 130.

In some implementations, the first heatsink 116 may be connected to the optical subassembly 122. For example, the first heatsink 116 may be disposed on the optical subassembly 122, and a thermal interface material (TIM) layer 126 may be disposed between the first heatsink 116 and the optical subassembly 122. In some implementations, the second wall 106 of the housing 102 may include an opening 132. The opening 132 may be adjacent to the platform 128. The opening 132 may be between the platform 128 and a front portion 134 of the second wall 106 of the housing 102. The first heatsink 116 may extend through the opening 132. For example, the first heatsink 116 may be located in the opening 132. In other words, the opening 132 may surround the first heatsink 116. The opening 132 may be sized such that the first heatsink 116 does not contact the housing 102 (e.g., an air gap is between the first heatsink 116 and the housing 102). Thus, the first heatsink 116 may be connected to the optical subassembly 122 and separated (e.g., thermally isolated by an air gap) from the housing 102 (e.g., from the second wall 106 and from the cover 110). Moreover, the second heatsink 118 may be separated (e.g., thermally isolated by an air gap) from the first heatsink 116. In this way, the first heatsink 116 and the second heatsink 118, which are in the same airflow path, may be thermally isolated from each other (e.g., by elimination of low-restriction thermal paths, such as the housing 102, between the first heatsink 116 and the second heatsink 118).

In some implementations, the optical subassembly 122 may be thermally connected to the first heatsink by a thermal path, and/or the DSP 124 may be thermally connected to the second heatsink by a thermal path (e.g., a heat pipe, a vapor chamber, or a conductive material path, such as copper or pyrolytic graphite). In some implementations, the front portion 134 of the second wall 106 of the housing 102 may be free of a heatsink (i.e., a distinct heatsink component, and not including heat dissipation provided by the housing 102 or the circuitry component 120). For example, a leading edge (i.e., an upstream edge) of the opening 132 may define a boundary (along the x-axis shown) from which all heatsinks (i.e., distinct heatsink components, and not including heat dissipation provided by the housing 102 or the circuitry component 120) of the optical module 100 are downstream in the airflow direction of the airflow path. As an example, a leading edge (i.e., an upstream edge) of the first heatsink 116 and a leading edge (i.e., an upstream edge) of the optical subassembly 122 may approximately align along the x-axis shown (e.g., within 2 millimeters or less of each other). In this way, an overall length of heatsinks in the optical module 100 is reduced (e.g., heatsinks above low power density regions of the circuitry component 120 may be eliminated), thereby reducing heatsink-induced airflow drag and improving airflow through the airflow path.

As indicated above, FIG. 3 is provided as an example. Other examples may differ from what is described with regard to FIG. 3.

Figure 4:
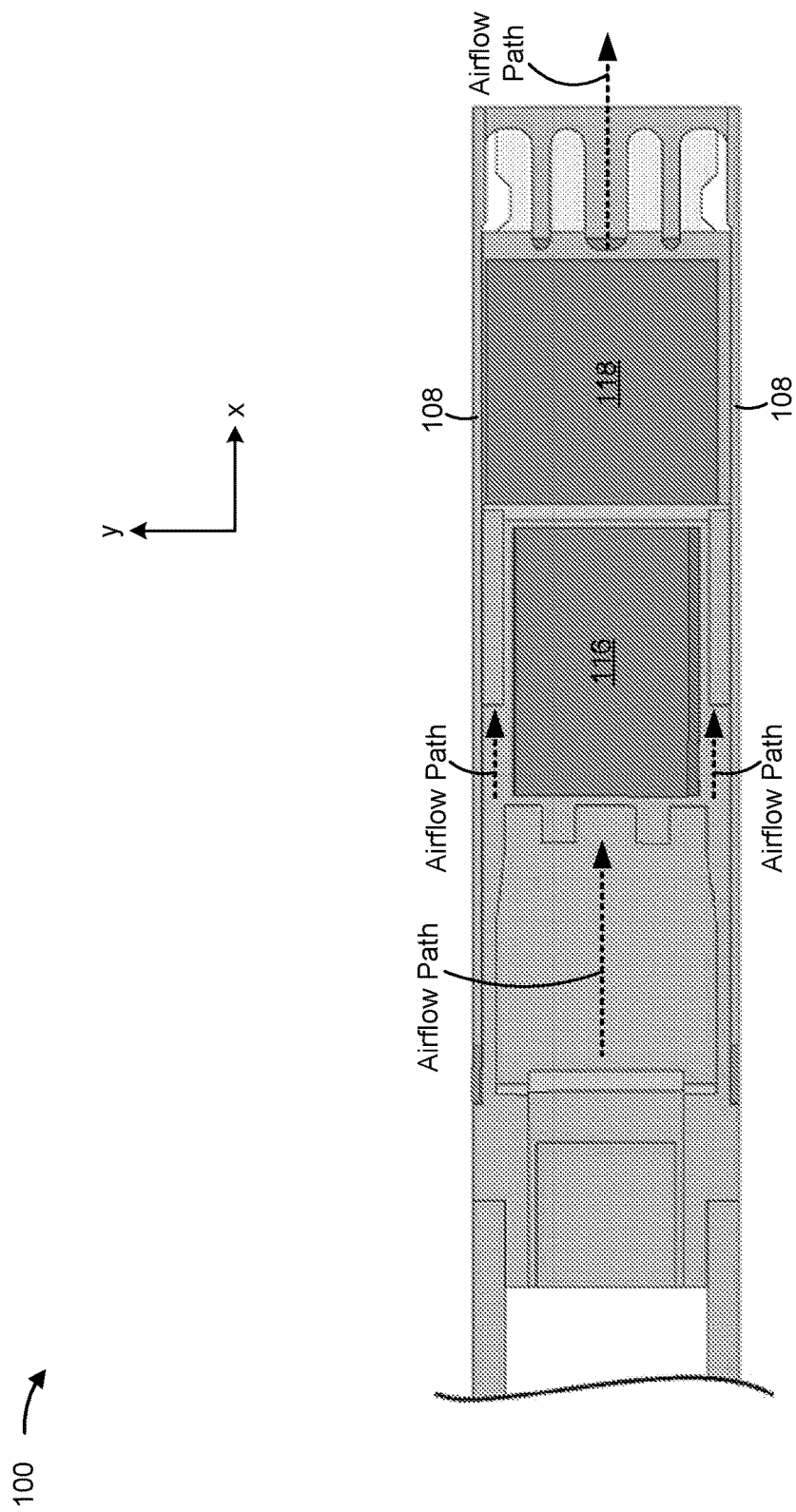
FIG. 4 is a top view of the optical module of the FIG. 1.

FIG. 4 is a top view of the optical module 100. In some implementations, a first width (e.g., a maximum width) of the first heatsink 116 (along the y-axis shown, transverse to an airflow direction through the first heatsink 116 or transverse to a direction in which a fin of the first heatsink 116 extends) and/or a second width (e.g., a maximum width) of the second heatsink 118 may be less than a width (e.g., a maximum width) of the airflow path. For example, the first width and/or the second width may be less than a distance between inward surfaces of the side rails 108. As an example, the first width may define an airflow path between the first heatsink 116 and at least one of the side rails 108.

In some implementations, the first width may be less than the second width. As shown, this may enable the airflow path to run along sides of the first heatsink 116 in addition to running through the first heatsink 116. In this way, an airflow rate at the second heatsink 118 may be improved, and a temperature of air reaching the second heatsink 118 may be reduced, thereby improving a performance of the second heatsink 118. In some implementations, the first width may be the same as the second width. For example, widths of both the first heatsink 116 and the second heatsink 118 may be less than the width of the airflow path, thereby improving an airflow rate through the optical module 100 to downstream components. As described above, in some implementations, the DSP 124 and the second heatsink 118 may be upstream of the optical subassembly 122 and the first heatsink 116 in an airflow direction (shown by the arrows) of the airflow path. Here, the second width of the second heatsink 118 may be less than the first width of the first heatsink 116. In other words, an upstream heatsink in the airflow direction of the airflow path may be less wide than a downstream heatsink in the airflow direction of the airflow path.

As indicated above, FIG. 4 is provided as an example. Other examples may differ from what is described with regard to FIG. 4.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical module, comprising:
   a housing that includes an opening,
      wherein the opening is configured to enable an airflow path that is along a length of the optical module;
   a circuitry component disposed within the housing, the circuitry component comprising an optical subassembly and a digital signal processor;
   a first heatsink above the optical subassembly,
      wherein the first heatsink is connected to the optical subassembly and separated from the housing; and
   a second heatsink above the digital signal processor,
      wherein the second heatsink is connected to the housing and separated from the first heatsink, and
      wherein the first heatsink and the second heatsink are configured to be positioned adjacent to each other along the length of the optical module, along a direction of the airflow path.

2. The optical module of claim 1, wherein the first heatsink and the second heatsink comprise plate fins.

3. The optical module of claim 1, wherein a first width of the first heatsink is less than a second width of the second heatsink.

4. The optical module of claim 1, wherein a first height of the first heatsink is less than a second height of the second heatsink.

5. The optical module of claim 1, wherein the housing comprises a first wall and a second wall opposite the first wall, and
   wherein the circuitry component is between the first wall and the second wall.

6. The optical module of claim 5, wherein a portion of the second wall is recessed toward the circuitry component to define a platform for the second heatsink, and
   wherein the second heatsink is connected to the platform.

7. The optical module of claim 5, wherein the second wall includes a portion of the opening, and
   wherein the first heatsink extends through the opening.

8. An optical module, comprising:
   a housing having a first wall and a second wall opposite the first wall,
      wherein the housing includes an opening that is configured to enable an airflow path along a length of the optical module;
   a circuitry component disposed within the housing between the first wall and the second wall, the circuitry component comprising an optical subassembly and a digital signal processor;
   a first heatsink above the optical subassembly,
      wherein the first heatsink is connected to the optical subassembly and separated from the housing, and
      wherein the second wall includes a portion of the opening and the first heatsink extends through the opening; and
   a second heatsink above the digital signal processor,
      wherein a portion of the second wall is recessed toward the circuitry component to define a platform for the second heatsink, and
      wherein the second heatsink is connected to the platform and separated from the first heatsink, and
      wherein the first heatsink and the second heatsink are configured to be positioned adjacent to each other along the length of the optical module, along a direction of the airflow path.

9. The optical module of claim 8, wherein a first width of the first heatsink is less than a second width of the second heatsink.

10. The optical module of claim 8, wherein a first height of the first heatsink is less than a second height of the second heatsink.

11. The optical module of claim 8, wherein the housing defines the airflow path from a front of the housing to a back of the housing, and
    wherein the first heatsink and the second heatsink are in the airflow path.

12. The optical module of claim 8, wherein the circuitry component comprises a circuit board.

13. The optical module of claim 8, wherein the optical module is in a pluggable form factor.

14. An optical module, comprising:
    a housing that includes an opening,
       wherein the opening is configured to enable an airflow path that is along a length of the optical module;
    a circuitry component disposed within the housing, the circuitry component comprising an optical subassembly and a digital signal processor;
    a first heatsink above the optical subassembly; and a second heatsink above the digital signal processor,
wherein the second heatsink is separated from the first heatsink by an air gap, and
wherein the first heatsink and the second heatsink are configured to be positioned adjacent to each other along the length of the optical module, along a direction of the airflow path.

15. The optical module of claim 14, wherein a first width of the first heatsink is less than a second width of the second heatsink.

16. The optical module of claim 14, wherein a first height of the first heatsink is less than a second height of the second heatsink.

17. The optical module of claim 14, wherein the housing comprises a first wall and a second wall opposite the first wall, and
wherein the circuitry component is between the first wall and the second wall.

18. The optical module of claim 17, wherein a portion of the second wall is recessed toward the circuitry component to define a platform for the second heatsink, and
wherein the second heatsink is connected to the platform.

19. The optical module of claim 18, wherein the second wall includes a portion of the opening, and
wherein the first heatsink extends through the opening.

20. The optical module of claim 14, wherein the first heatsink is connected to the optical subassembly and separated from the housing.

* * * * *